United States Patent [19]

Kneisel et al.

[11] 4,157,517

[45] Jun. 5, 1979

[54] ADJUSTABLE TRANSMISSION LINE FILTER AND METHOD OF CONSTRUCTING SAME

[75] Inventors: Thomas F. Kneisel, Davie; Robert L. Benenati, Tamarac, both of Fla.

[73] Assignee: Motorola, Inc., Schaumburg, Ill.

[21] Appl. No.: 861,784

[22] Filed: Dec. 19, 1977

[51] Int. Cl.$^2$ .......................... H03H 9/00; H01P 1/20

[52] U.S. Cl. .................................... 333/205; 333/207; 29/600

[58] Field of Search ................. 333/73 R, 73 C, 73 S, 333/73 W, 83 R; 29/600, 601

[56] References Cited

U.S. PATENT DOCUMENTS

| | | | |
|---|---|---|---|
| 3,348,173 | 10/1967 | Matthei et al. | 333/73 S |
| 3,505,618 | 4/1970 | McKee | 333/73 R |
| 3,593,217 | 7/1971 | Weber | 333/70 S |
| 3,947,934 | 4/1976 | Olson | 333/70 S |
| 4,053,855 | 10/1977 | Kivi et al. | 333/73 W |

*Primary Examiner*—Alfred E. Smith
*Assistant Examiner*—Harry E. Barlow
*Attorney, Agent, or Firm*—Donald B. Southard; James W. Gillman

[57] ABSTRACT

Transmission line filter adapted to respond to a predetermined frequency, having a resonator conducting layer with dielectric material on opposite sides thereof and a ground plane conducting layer on the outside surfaces of the dielectric material. The filter may be of the stripline or microstrip type having a resonator constructed so that it tends to operate at a frequency different from the desired frequency, and which is not accessible for trimming after the filter is constructed. The ground plane layer is accessible so that a portion thereof can be removed after the filter is constructed to change the electrical parameters of the line formed by the resonator and the ground plane layer to change the response frequency of the filter. Alternatively, conducting material can be added to an opening in the ground plane conducting layer to change the response frequency of the filter. The ground plane layer can be removed by a sand blast, laser beam or other means, and can be added by the use of conductive paint, to trim the frequency of the filter after it is constructed.

11 Claims, 5 Drawing Figures

ADJUSTABLE TRANSMISSION LINE FILTER AND METHOD OF CONSTRUCTING SAME

BACKGROUND OF THE INVENTION

Stripline and other transmission line type filters have been used in miniature electronic devices to provide filters of small size which can be constructed at low cost. In such filters, the frequency response depends upon the configuration of the conducting layer which forms the edge coupled transmission lines, and the dielectric constant of the surrounding material. When such a filter is provided by production techniques used for low cost construction, variations in the dielectric constant of the material and in the dimensions will occur, which may result in substantial changes in the frequency response, so that the resulting filters may have a frequency response outside the desired frequency limits.

It has been proposed to use adjustable devices, such as trimming screws or external capacitors, with stripline filters to change the response frequency of the filter. Also, clamping arrangements have been used to compress the dielectric material and thereby change the electrical parameters of the line. However, these devices have substantially increased the size and cost of the filter so that this has not been a satisfactory solution.

SUMMARY OF THE INVENTION

It is an object of the invention to provide an improved transmission line type filter which is of inexpensive construction and wherein the frequency response can be trimmed to tightly specified limits.

Another object of the invention is to provide an improved stripline filter wherein the resonant frequency can be tuned after the filter is constructed.

A further object of the invention is to provide a method producing an edge coupled transmission line filter wherein the filter is tuned to the desired frequency after it is completed and sealed.

Still another object of the invention is to provide a method of trimming a sealed transmission line type filter having a conducting resonator which is not accessible, by testing the filter and altering an accessible part of the filter to adjust the frequency response thereof.

A still further object of the invention is to provide a stripline type filter having a resonator of a configuration to provide a resonant frequency different from the desired frequency, wherein a portion of the ground plane conductor adjacent the resonator is removed or added after the filter is constructed to trim the resonant frequency to the desired value.

In accordance with the invention, a stripline filter is constructed by forming a thin film conducting resonator on a ceramic substrate having a ground plane conducting layer on the opposite side, with a second ceramic substrate positioned on the resonator and having a ground plane conducting layer on the outside surface. The substrates are sealed together as by use of a laminate so that the resonator is not accessible. The filter may be of the interdigital type having a plurality of resonator fingers each connected at one end to a ground plane conducting layer, with the other end being an open circuit. Signals are applied to and derived from the resonator fingers so that the device forms a filter. The resonator fingers have configurations (length, width, etc.) and the dielectric constant of the ceramic plates are such that the resonant frequency of the filter is different from the desired frequency. A portion of the ground plane conducting layer can be removed or conducting material can be added, to change the electrical parameters of the transmission line to thereby change the frequency response of the filter. When the resonator is designed so that the resonant frequency thereof is below the desired frequency, a part of the ground plane conducting layer adjacent an open circuit end of a resonator finger can be removed to reduce the capacitance between this open circuit end and the ground plane to thereby raise the response frequency of the filter to the desired value. If the frequency of the resonator is above the desired frequency, conducting material can be added to the ground plane to reduce the response frequency.

The filter of the invention can be sealed as a unit and tested, with one or more portions of the ground plane layer being removed or added during the testing to accurately trim the filter frequency. A sand blast, laser beam, sharp tool or any other known means can be used to remove the ground plane layer, and conductive paint can be used to add to the ground plane. It is therefore possible to remove or add portions of the ground plane conducting layer, which is on the outside of the filter, while the filter is being tested to accurately trim the response frequency of the filter.

DETAILED DESCRIPTION OF THE PREFERRED EMBODIMENT

Figure 1:
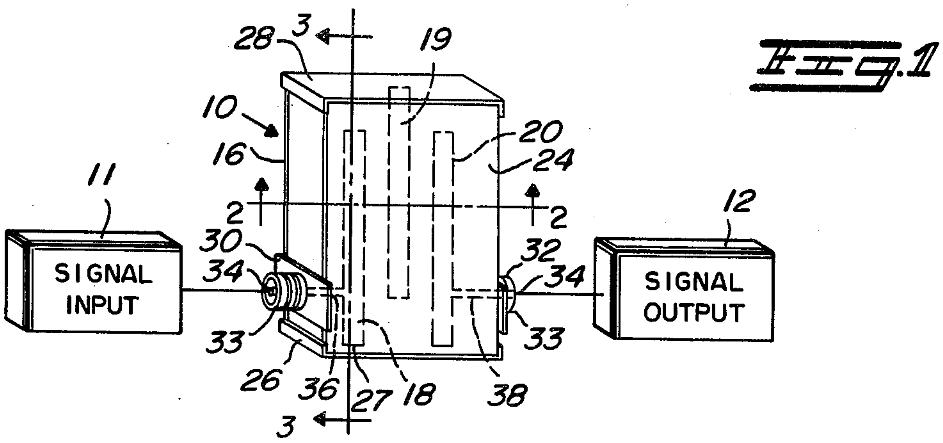
FIG. 1 is a schematic diagram illustrating the stripline filter of the invention and showing its use.
Figure 2:
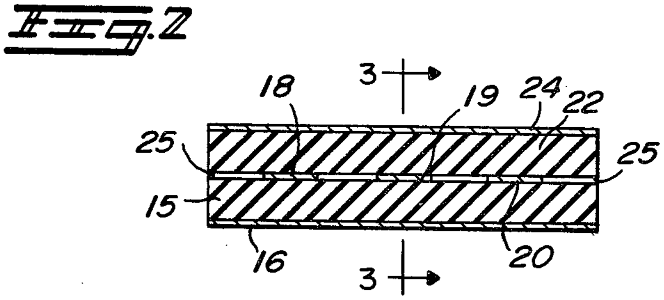
FIG. 2 is a cross-section of the filter along the line 2—2 of FIG. 1.
Figure 3:
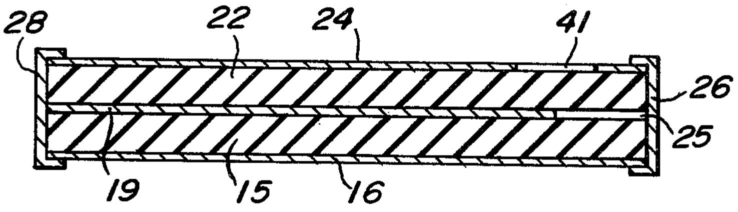
FIG. 3 is a cross-section of the filter along the line 3—3 of FIG. 1.
Figure 4:
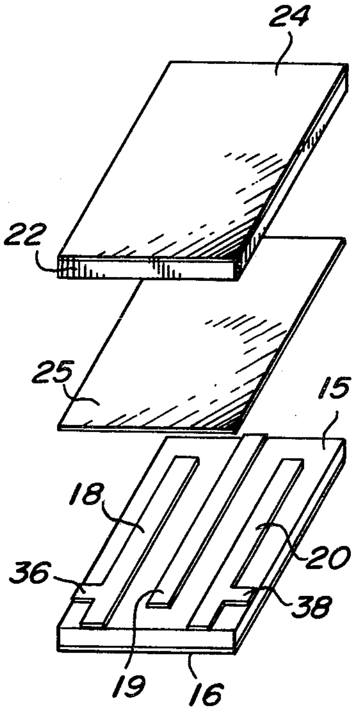
FIG. 4 is an exploded view of the substrates and the laminate forming the filter.

FIG. 1 illustrates the filter 10 of the invention to which signals are applied from a signal input 11, and from which signals are extracted by a signal output 12. As shown by FIGS. 1, 2, 3 and 4, the filter 10 includes a thin dielectric plate or substrate 15 which may be of a ceramic material, such as alumina, or of other dielectric material such as glass epoxy, having a dielectric constant greater than one. A solid thin film conducting layer 16, such as an electroplated copper layer, is provided on one side of the substrate 15, and a resonator conducting layer including spaced fingers 18, 19 and 20 is formed on the other side. A second ceramic plate or substrate 22 is laminated against the resonator fingers, and has a conducting layer 24 on the outside surface. As shown by FIG. 4, the substrates 15 and 22 may be secured together by placing a layer of adhesive or laminate 25 therebetween. Pressure is applied to produce a sealed structure, with the laminate tending to flow into the spaces between the conducting fingers.

End conductors 26 and 28 connect the outside conducting layers 16 and 24 to provide a ground plane conductor which surrounds the conducting resonator (18, 19, 20). The end conductors 26 and 28 may be formed as conducting layers on the substrates 15 and 22, or as conducting clips which have ends engaging the layers 16 and 24 and electrically connected thereto, as shown by FIG. 3.

As shown by FIG. 1, the filter 10 includes input and output connectors 30 and 32 to connect the filter in an electrical circuit. These connectors may be coaxial connectors each having an outer tubular grounding conductor 33 and an inner signal conductor 34. The outer conductors 33 are connected to the conducting layers 16 and 24 to provide a ground connection to the ground plane conductor of the filter. The conducting resonator (18, 19, 20) is of the interdigital type, with finger 18 being connected to the ground plane conductor by the end conductor 26 at point 27 (FIG. 1). The input signal as applied to resonator 18 from the center conductor 34 of connector 30 by conductor 36 (FIGS. 1 and 4), which may be formed as a conducting layer on substrate 15 at the same time the fingers 18, 19 and 20 are formed thereon. Finger 19 is connected to the ground plane by end conductor 28 (FIG. 3), and finger 20 is connected to end conductor 26. The finger 20 is connected to the center conductor 34 of connector 32 by a conductor 38, which is formed as a layer on substrate 15 along with the conducting resonator fingers.

The filter as described forms a complete operative unit, which may serve as a three resonator bandpass filter. Filters providing other filter characteristics can be formed in generally the same way. For example, interdigital filters having more or less than three fingers can be provided, and combine, half-wave, and other forms of parallel, edge coupled transmission line configurations can be used. The frequency characteristics of the filter depend upon the configuration of the conducting resonator fingers, the spacing thereof with respect to the ground plane conductor and the dielectric constant of the material therebetween. It is to be understood, however, that a number of loss responsive characteristics may be provided by the filter depending upon the selected dimensional parameters thereof. It is well known in the art to arrange the filter parameters to effect various responses, such as, Butterworth Chebycheff, minimum loss, or still other filter frequency response characteristics. The particular response characteristic, of course, is chosen to best fit the particular application into which the filter is to be utilized. Any variation in the configuration of the resonator, or in the thickness of the dielectric substrates will cause a variation in the frequency response of the filter. Accordingly, the dimensions of the filter as described must be held within very close tolerances to provide a filter having a particular frequency response, and this is not practical when using mass production techniques.

Figure 5:
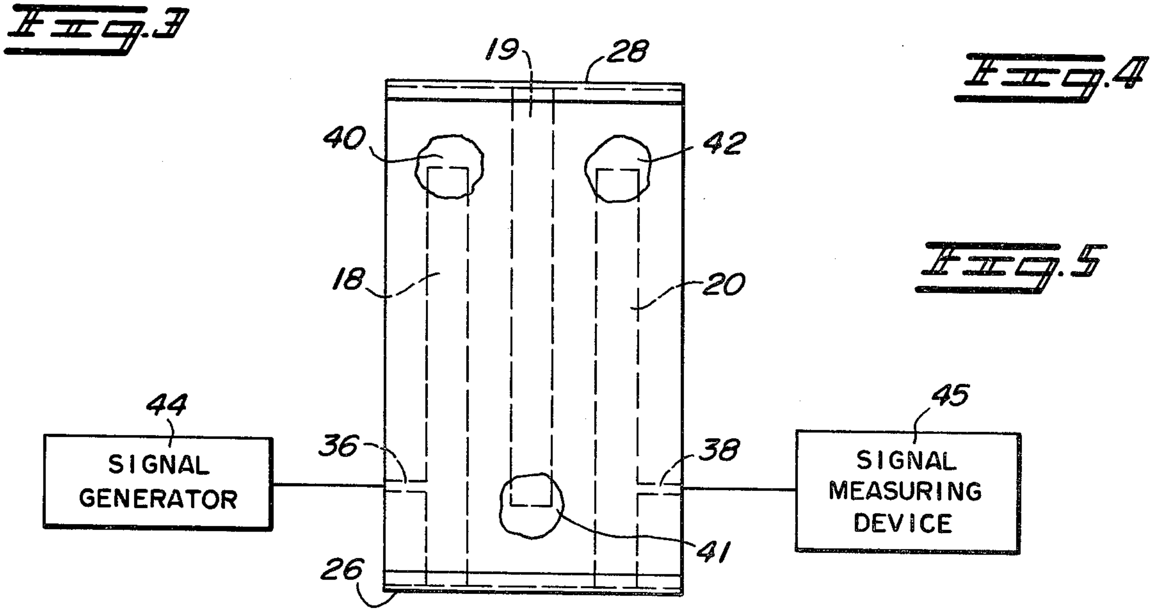
FIG. 5 illustrates the method of trimming the filter.

In accordance with this invention, the stripline filter which is described can be easily trimmed after it is constructed and sealed to provide the desired frequency response. This is accomplished by selecting the dimensions of the components, such as the configuration of the conducting resonator, so that the resonant frequency of the filter is below the desired frequency. For example, the fingers can be slightly longer than one-quarter wavelength at the desired frequency. Then, after the stripline filter is completed it is tested, as by applying signals thereto and measuring the response, as illustrated by FIG. 5. The resonant frequency of the filter can be raised by removing parts of the ground plane conductor adjacent the open circuit ends of the resonator fingers 18, 19 and 20, to reduce the capacitance between the fingers and the ground plane conductor and thereby raise the resonant frequency. The resonator fingers are individually tuned by removing parts of the ground plane conductor adjacent each finger. This is illustrated by FIG. 5 which shows that the ground plane layer 24 has been removed at regions 40, 41 and 42 adjacent the open circuit ends of resonator fingers 18, 19 and 20, respectively.

The signal generator 44 can apply a range of frequencies to the filter 10 and the frequency measuring device 45 will indicate the response at the different frequencies. The layer 24 can be removed adjacent each resonator finger as by a controlled sand blast, until the response has the desired characteristic at a particular frequency. For example, material can be removed until the response is maximum at the desired frequency. It will be apparent that the conducting ground plane can be removed by other means, such as by use of a diamond point or other sharp tool, or by a laser beam, when such means is more practical in a particular application.

Although reference has been made to removal of regions in ground plane layer 24, it will be apparent that regions in layer 16 can also be removed. Also, if regions of the ground plane conductor are removed such that the resonant frequency goes above the desired frequency, parts of such regions can be coated, as by use of conductive paint, to increase the capacity and lower the response frequency to bring the filter to the desired frequency. It is also possible to provide openings in the ground plane conducting layer during the construction of the filter, and then the filter can be tested and conductive material added during the testing to bring the filter response frequency to the desired value.

The transmission line filter which as been described has been found to be suitable for construction by low cost mass production techniques. Since the resonant frequency can be changed after the filter is completed and sealed, the filter can be trimmed to provide the desired frequency response with great accuracy. The resulting filter is, therefore, highly desirable for use in miniature electronic devices.

What is claimed is:

1. A transmission line filter adapted for use at a predetermined frequency, including in combination:

conductor means forming a ground plane;

conducting resonator means spaced from said ground plane conductor means and cooperating therewith to form a transmission line;

said resonator means being of a configuration to provide a particular loss response characteristic at a frequency spaced from said predetermined frequency; and said ground plane conductor means having a portion removed therefrom to provide an opening therein selected to change the electrical parameters of the transmission line to tune the response frequency of the filter to the predetermined frequency.

2. A filter in accordance with claim 1 wherein said resonator means is constructed to be resonant at a frequency below the predetermined frequency, and said opening in said ground plane conductor means acts to reduce the capacitance between said resonator means and said ground plane conductor means and thereby increase the resonant frequency of the filter so that the filter has the desired response at the predetermined frequency.

3. A filter in accordance with claim 1 further including conducting means positioned at said opening in said ground plane conductor means and operative to decrease the response frequency of the filter.

4. A filter in accordance with claim 1 including first and second dielectric substrates positioned on opposite sides of said resonator means, and wherein said ground plane conductor means is formed by layers on the sides of said first and second substrates remote from said resonator means.

5. A filter in accordance with claim 4 wherein said resonator means is positioned on one of said first and second substrates, and further including laminating material between said first and second substrates and sealing the same together as a unit.

6. A stripline filter in accordance with claim 4 wherein said resonator means includes a plurality of interdigital fingers formed as a conducting layer on one of said first and second substrates.

7. A stripline filter in accordance with claim 6 further including input and output connectors each having a signal conductor and a grounding conductor, with said grounding conductor being connected to said ground plane conductor means, and wherein said interdigital fingers include an input finger and an output finger, and said conducting layer forming said resonator means includes a portion connecting said signal conductor of said input connector to said input finger and a portion connecting said output finger to said signal conductor of said output connector.

8. In a transmission line filter which has a conducting resonator with dielectric material thereabout and a ground plane conductor on the outside of the filter unit, the method of tuning the filter including the steps of:

(a) constructing the filter so that it provides a particular loss response characteristic at a frequency differing from the desired frequency;

(b) measuring the frequency response of the filter; and (c) removing a portion of the outer ground plane conductor to change the electrical parameters of the transmission line formed by the conducting resonator and the ground plane conductor to thereby tune the filter for the desired frequency response.

9. The method of claim 8 including the further step of adding conductive material to the ground plane conductor to tune the filter to decrease the response frequency thereof.

10. The method of claim 8 further including the step of applying signals to the filter including signals of the predetermined frequency, measuring the frequency response of the filter, and removing a part of the ground plane conductor during such measuring to tune the filter for the desired frequency response.

11. The method of claim 10 wherein the portion of the ground plane conductor which is removed is adjacent to an open circuit portion of the resonator and acts to increase the response frequency of the filter.

* * * * *